US009535440B2

(12) United States Patent
Seo et al.

(10) Patent No.: US 9,535,440 B2
(45) Date of Patent: Jan. 3, 2017

(54) DC-DC CONVERTER AND ORGANIC LIGHT EMITTING DISPLAY DEVICE USING THE SAME

(71) Applicant: Samsung Display Co., LTD., Yongin, Gyeonggi-Do (KR)

(72) Inventors: Jeong-Min Seo, Yongin (KR); Sung-Cheon Park, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 269 days.

(21) Appl. No.: 13/836,358

(22) Filed: Mar. 15, 2013

(65) Prior Publication Data

US 2014/0118414 A1 May 1, 2014

(30) Foreign Application Priority Data

Oct. 30, 2012 (KR) .................. 10-2012-0121374
Oct. 30, 2012 (KR) .................. 10-2012-0121414

(51) Int. Cl.
*G09G 5/10* (2006.01)
*G05F 1/595* (2006.01)
(Continued)

(52) U.S. Cl.
CPC ............. *G05F 1/595* (2013.01); *G09G 3/3208* (2013.01); *H02M 3/156* (2013.01); *H02M 3/158* (2013.01);
(Continued)

(58) Field of Classification Search
CPC ............... H02M 2001/0012; H02M 2001/007; H02M 2001/009; H02M 3/00; H02M 3/156; H02M 3/158; G05F 1/595; G05F 1/46; G05F 1/462; G05F 1/56; G05F 1/565; G05F 1/575; G05F 1/62; G09G 3/3208; G09G 2330/028; G09G 2330/02; G09G 2330/021; H05B 33/0815; H05B 33/0824; H05B 33/0896; H03K 17/122
See application file for complete search history.

(56) References Cited

U.S. PATENT DOCUMENTS 6,414,860 B1 *   7/2002   Li .................................... 363/49
7,315,153 B2     1/2008   Tazawa et al.
(Continued)

FOREIGN PATENT DOCUMENTS

KR    10-2005-0015121 A    2/2005
KR    10-2005-0051074 A    6/2005
(Continued)

OTHER PUBLICATIONS

Applicants' cross-referenced copending U.S. Appl. No. 13/834,315, filed Mar. 15, 2013 (not published yet).
(Continued)

*Primary Examiner* — Srilakshmi K Kumar
*Assistant Examiner* — Parul Gupta
(74) *Attorney, Agent, or Firm* — Robert E. Bushnell, Esq.

(57) ABSTRACT

There are provided a DC-DC converter and an organic light emitting display device using the same. A DC-DC converter includes a converting module and a sensing unit. The converting module includes a switching module and a control module. The switching module has a plurality of switches, and each of the plurality of switches converts an input voltage into a first voltage and outputs the first voltage while being turned on/off in response to a corresponding pulse width modulation (PWM) signal. The control module controls a switching operation of the switching module by generating the PWM signal. The sensing unit senses driving current supplied to a load to which the first voltage is provided.

10 Claims, 4 Drawing Sheets

(51) Int. Cl.
*G09G 3/32* (2016.01)
*H02M 3/156* (2006.01)
*H02M 3/158* (2006.01)
*H05B 33/08* (2006.01)
*H03K 17/12* (2006.01)

(52) U.S. Cl.
CPC ........ *H03K 17/122* (2013.01); *H05B 33/0815* (2013.01); *H05B 33/0824* (2013.01); *H05B 33/0896* (2013.01); *G09G 2330/028* (2013.01)

(56) References Cited

U.S. PATENT DOCUMENTS

| | | | |
|---|---|---|---|
| 7,671,575 B1 | 3/2010 | Suzuki et al. | |
| 7,808,299 B2 | 10/2010 | Mao et al. | |
| 9,013,380 B2* | 4/2015 | Seo | G09G 3/3208 341/50 |
| 9,337,718 B2* | 5/2016 | Park | H05B 33/0815 |
| 2005/0116657 A1 | 6/2005 | Park et al. | |
| 2005/0219877 A1* | 10/2005 | Chang | H02M 3/073 363/59 |
| 2006/0175986 A1* | 8/2006 | Lee et al. | 315/312 |
| 2006/0255777 A1 | 11/2006 | Koertzen | |
| 2007/0190369 A1 | 8/2007 | Leach et al. | |
| 2007/0273306 A1 | 11/2007 | Fujino et al. | |
| 2008/0160075 A1 | 7/2008 | Xie et al. | |
| 2008/0174287 A1* | 7/2008 | Park | H02M 3/158 323/271 |
| 2008/0246702 A1 | 10/2008 | Lee et al. | |
| 2008/0266917 A1* | 10/2008 | Lin et al. | 363/80 |
| 2009/0040244 A1* | 2/2009 | Lee et al. | 345/690 |
| 2009/0273738 A1* | 11/2009 | Fukumoto | 349/70 |
| 2010/0219803 A1* | 9/2010 | Han et al. | 323/284 |
| 2010/0220039 A1 | 9/2010 | Park et al. | |
| 2011/0062874 A1* | 3/2011 | Knapp | 315/158 |
| 2011/0156606 A1 | 6/2011 | Hwang et al. | |
| 2013/0241808 A1* | 9/2013 | Kwon | H02M 3/158 345/76 |

FOREIGN PATENT DOCUMENTS

| | | |
|---|---|---|
| KR | 10-2009-0054161 A | 5/2009 |
| KR | 10-2010-0107238 A | 10/2010 |
| KR | 10-2011-0073991 A | 6/2011 |
| TW | 200806007 A | 1/2008 |

OTHER PUBLICATIONS

Office Action issued from the Taiwan Patent Office on Aug. 9, 2016 with respect to the Taiwan Patent Application No. 102114733 filed on Apr. 25, 2013 and Request for Entry of the Accompanying Office Action attached herewith.

* cited by examiner

DC-DC CONVERTER AND ORGANIC LIGHT EMITTING DISPLAY DEVICE USING THE SAME

CROSS-REFERENCE TO RELATED APPLICATIONS

This application claims priority to and the benefit of Korean Patent Application No. 10-2012-0121414, filed on Oct. 30, 2012, in the Korean Intellectual Property Office, the entire content of which is incorporated herein by reference. Furthermore, the present application is related to a co-pending U.S. application Ser. No.(to be assigned), entitled DC-DC CONVERTER AND ORGANIC LIGHT EMITTING DISPLAY DEVICE USING THE SAME, based upon Korean Application No. 10-2012-0121374, filed on Oct. 30, 2012 in the Korean Intellectual Property Office (KIPO).

BACKGROUND

Field

An aspect of the present invention relates to a DC-DC converter and an organic light emitting display device using the same, and more particularly, to a DC-DC converter and an organic light emitting display device using the same which has optimal efficiency by adaptively operating according to a load condition.

Description of the Related Art

Among flat panel display devices, an organic light emitting display device displays images using organic light emitting diodes (OLEDs) that emit light through recombination of electrons and holes. The OLED includes an anode electrode, a cathode electrode and a light emitting layer positioned between the anode and cathode electrodes. If current flows through the OLED in the direction from the anode electrode to the cathode electrode, the OLED emits light, thereby expressing a color. In the organic light emitting display device, emission luminance is determined according to the amount of current flowing through the OLED of each pixel. Therefore, a high-luminance image requires more driving current than a low-luminance image. That is, the driving current required to drive pixels of the organic light emitting display device is changed depending on a displayed image. Accordingly, in order to reduce power consumption, a DC-DC converter for driving the pixels of the organic light emitting display device should be designed to have high efficiency throughout the entire range of the driving current. However, the switching frequency of a related art DC-DC converter is fixed to a frequency at which DC-DC conversion can be normally performed under the maximum load condition, and therefore, the efficiency is degraded as the load decreases.

SUMMARY

Embodiments provide a DC-DC converter and an organic light emitting display device using the same which has optimal efficiency by adaptively operating according to a load condition.

According to an aspect of the present invention, there is provided a DC-DC converter, including a converting module and a sensing unit. The converting module includes a switching module and a control module. The switching module has a plurality of switches, and each of the plurality of switches converts an input voltage into a first voltage and outputs the first voltage while being turned on or off in response to a corresponding pulse width modulation (PWM) signal. The control module controls a switching operation of the switching module by generating the PWM signal. The sensing unit senses driving current supplied to a load to which the first voltage is provided. The control module is configured to adaptively control the frequency of the PWM signal according to a sensed result of the sensing unit.

According to an aspect of the present invention, there is provided an organic light emitting display device, including: a display panel that has a plurality of pixels, and displays a gray scale according to the luminance of an organic light emitting diode in each pixel; a timing controller that provides the display panel with scan and data signals for allowing the organic light emitting diode in each pixel to emit light; and a DC-DC converter that receives an input voltage so as to generate first and second voltages for supplying current to the organic light emitting diode and to provide the first and second voltages to the display panel. The DC-DC converter includes: a first converting module that receives the input voltage so as to generate the first voltage; a second converting module that receives the input voltage so as to generate the second voltage; and a sensing unit that senses driving current supplied to the display panel. Each of the first and second converting modules includes: a switching module that has a plurality of switches, with each of the plurality of switches converting an input voltage into a first voltage and outputting the first voltage while being turned on or off in response to a corresponding PWM signal; and a control module that controls a switching operation of the switching module by generating the PWM signal, At least one of the control modules of the first and second converting modules is configured to adaptively control the frequency of the PWM signal according to the sensed result of the sensing unit.

As described above, according to the present invention, it is possible to provide a DC-DC converter and an organic light emitting display device using the same which has optimal efficiency by adaptively operating according to a load condition.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
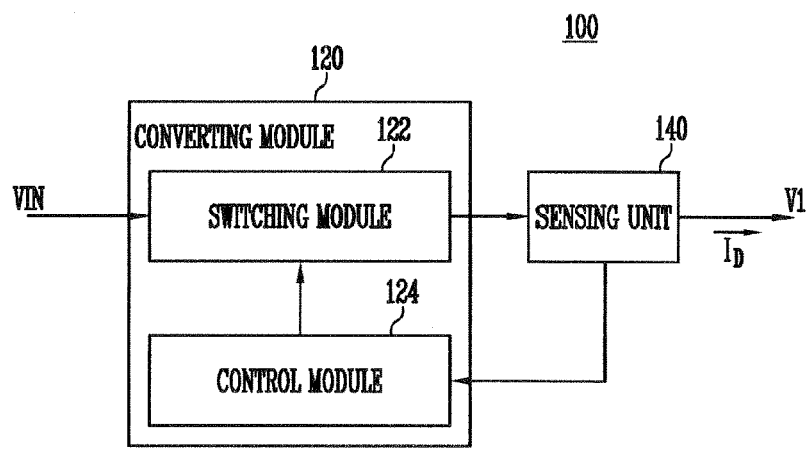
FIG. 1 is a diagram illustrating a DC-DC converter according to an embodiment of the present invention.

Hereinafter, certain exemplary embodiments according to the present invention will be described with reference to the accompanying drawings. Here, when a first element is described as being coupled to a second element, the first element may be not only directly coupled to the second element but may also be indirectly coupled to the second element via a third element. Further, some of the elements that are not essential to the complete understanding of the invention are omitted for clarity. Also, like reference numerals refer to like elements throughout.

FIG. 1 is a diagram illustrating a direct current to direct current (DC-DC) converter according to an embodiment of the present invention.

Referring to FIG. 1, the DC-DC converter 100 according to this embodiment includes a converting module 120 and a sensing unit 140.

The converting module 120 receives an input voltage VIN so as to generate a first voltage V1. The sensing unit 140 senses the capacity of a load to which the first voltage V1 is provided, i.e., driving current $I_D$ provided to the load.

The converting module 120 is a kind of switching regulator, and performs pulse width modulation (PWM) driving. The converting module 120 operates by varying a switching frequency according to the sensed result of the sensing unit 140.

The converting module 120 includes a switching module 122 and a control module 124.

The switching module 122 has a plurality of switches, and each of the plurality of switches converts an input voltage VIN applied from the outside of the switching module 122 into a first voltage V1 and outputs the first voltage V1 while being turned on/off in response to a corresponding PWM signal.

The control module 124 controls a switching operation of the switching module 122 by generating the PWM signal. The control module 124 is configured to adaptively control the frequency of the PWM signal according to the sensed result of the sensing unit 140.

In the DC-DC converter 100, the driving current $I_D$ decreases when the capacity of the load is relatively small, and therefore, switching loss according to the parasitic capacitance of the switch increases. The driving current $I_D$ increases when the capacity of the load is relatively large, and therefore, conduction loss according to the turn-on resistance of the switch increases. The switching loss is in proportion to the frequency of the PWM signal. Thus, in order to minimize the switching loss, the control module 124 of the DC-DC converter 100 adaptively controls the frequency of the PWM signal according to the driving current $I_D$. Specifically, the control module 124 increases the frequency of the PWM signal when the driving current $I_D$ increases, and decreases the frequency of the PWM signal when the driving current $I_D$ decreases. In this case, the PWM driving of the converting module 120 may be performed in a continuous conduction mode (CCM), or may be performed in a combined mode of the CCM and a discontinuous conduction mode. As a result, the switching module 122 of the DC-DC converter 100 minimizes the switching loss when voltage conversion is performed, so that the DC-DC converter 100 can have optimal efficiency, regardless of various load conditions.

The DC-DC converter 100 may generate the first voltage V1 by increasing or decreasing the input voltage VIN, and may generate the first voltage V1 by reversing the polarity of the input voltage VIN. The driving current $I_D$ of the load coupled to an output terminal of the DC-DC converter 100 is variable. For example, the first voltage V1 may be a voltage ELVDD applied to an anode of an organic light emitting diode of each pixel in an organic light emitting display device or a voltage ELVSS applied to a cathode of the organic light emitting diode of each pixel in the organic light emitting display device.

Figure 2:
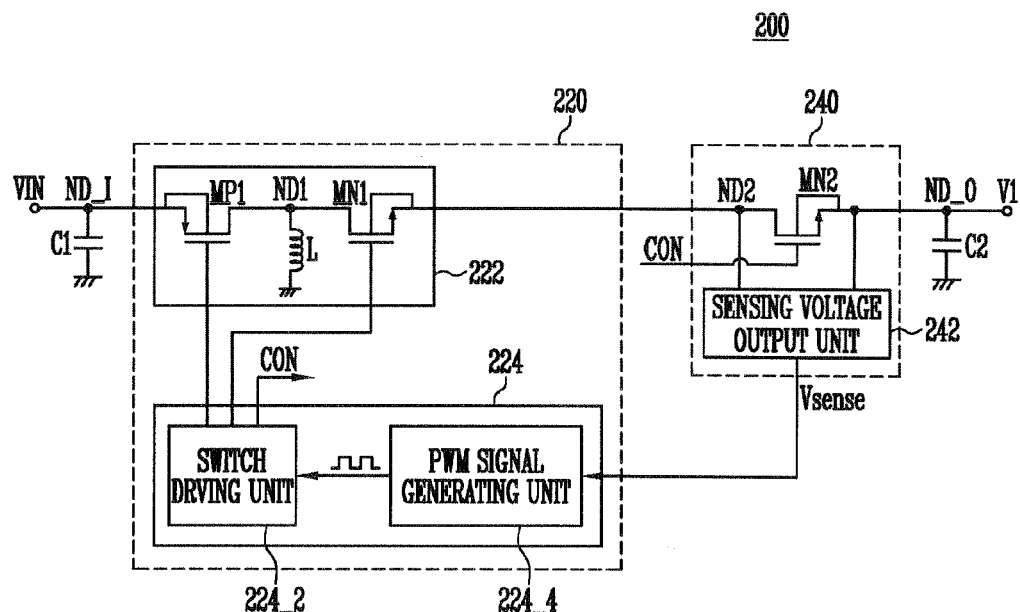
FIG. 2 is a diagram illustrating an embodiment of the DC-DC converter shown in FIG. 1.

FIG. 2 is a diagram illustrating an embodiment of the DC-DC converter shown in FIG. 1.

Referring to FIG. 2, in a DC-DC converter 200 according to this embodiment, a switching module 222 includes a first switch MP1, an inductor L and a second switch MN1.

The first switch MP1 is coupled between a first node ND1 and an input node ND_I to which the input voltage VIN is input, and forms or blocks a current path. The inductor L is coupled between the first node ND1 and a ground, and generates an electromotive force, based on an increase/decrease in input current according to the input voltage VIN. The second switch MN1 is coupled between the first node ND1 and a second node ND2, and forms or blocks a current path.

The first switch MP1 allows the input current to be supplied to or blocked from the inductor L, so that the inductor L generates the electromotive force. The second switch MN1 supplies or blocks a back electromotive force formed in the inductor L while the input current is blocked. The first switch MP1 and the second switch MN1 may generate and output the first voltage while being alternately turned on/off.

A sensing unit 240 includes a third switch MN2 and a sensing voltage output unit 242.

The third switch MN2 is coupled between the second node ND2 and an output node ND_O, and forms or blocks a current path. The sensing voltage output unit 242 is coupled to both terminals of the third switch MN2 so as to output a sensing voltage Vsense according to the driving current. In a case where a separate resistor is added to sense the driving current, loss additionally occurs due to the separate resistor. Therefore, in order to minimize the loss, the driving current is preferably sensed using the turn-on resistance of the third switch MN2. When the DC-DC converter 200 is shut down, the third switch MN2 is in an off-state so as to block a leakage current path formed between the input node ND_I and the output node ND_O. The third switch MN2 is turned on/off in response to a control signal CON. The third switch MN2 is turned on in the normal operation of the DC-DC converter 200, and is turned off when the shut down of the DC-DC converter 200.

A control module 224 includes a PWM signal generating unit 224_4 and a switch driving unit 224_2.

The PWM signal generating unit 224_4 generates the PWM signal having a frequency determined according to the sensing voltage Vsense, and provides the generated PWM signal to the switch driving unit 224_2. If the sensing voltage Vsense increases, the PWM signal generating unit 224_4 increases the frequency of the PWM signal. If the sensing voltage Vsense decreases, the PWM signal generating unit 224_4 decreases the frequency of the PWM signal.

The switch driving unit 224_2 receives the PWM signal input from the PWM signal generating unit 224_4 so as to control the first and second switches MP1 and MN1. The switch driving unit 224_2 controls the first and second switches MP1 and MN1 so that the phases of PWM signals for controlling the respective first and second switches MP1 and MN1 are opposite to each other. In this case, the first and second switches MP1 and MN1 are alternately turned on/off. The switch driving unit 224_2 may generate a control signal CON for controlling the third switch MN2.

The DC-DC converter 200 may be an inverting buck-boost converter that generates the first voltage V1 by inverting the polarity of the input voltage VIN. The first switch MP1 may be implemented as a PMOS transistor, and the second and third switches MN1 and MN2 may be implemented as NMOS transistors.

The DC-DC converter 200 generates and outputs the first voltage V1 by inverting the input voltage VIN through the switching operation in which the first and second switches MP1 and MN1 are alternately turned on/off. Specifically, in a case where the first switch MP1 is turned on and the second switch MN1 is turned off, the input voltage VIN is applied to the first node ND1. Accordingly, the current flowing in the inductor L is gradually increased, and a predetermined energy is charged in the inductor L. In a case where the first switch MP1 is turned off and the second switch MN1 is turned on, the energy charged in the inductor L is represented in the form of a back electromotive force at both terminals of the inductor L as the flow of current is suddenly cut off and then provided to the output node ND_O. Therefore, the first voltage V1 having a polarity different from that of the input voltage VIN is output to the output node ND_O.

The DC-DC converter 200 may further include a first capacitor C1 coupled between the input node ND_I and the ground, and a second capacitor C2 coupled between the output node ND_O and the ground. In a case where the DC-DC converter 200 is implemented as a semiconductor chip, the inductor L of the switching module 220, the first capacitor C1 and the second capacitor C2 may be coupled to the semiconductor chip from the outside of the semiconductor chip.

Figure 3:
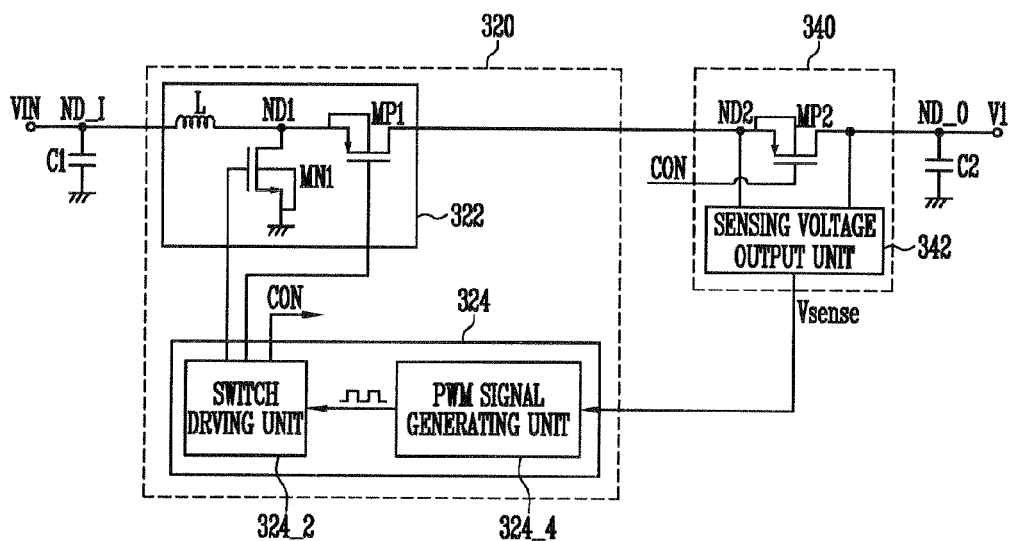
FIG. 3 is a diagram illustrating another embodiment of the DC-DC converter shown in FIG. 1.

FIG. 3 is a diagram illustrating another embodiment of the DC-DC converter shown in FIG. 1.

Referring to FIG. 3, in a DC-DC converter 300 according to this embodiment, a switching module 322 includes an inductor L, a first switch MN1 and a second switch MP1.

The inductor L is coupled between a first node ND 1 and an input node ND_I to which an input voltage VIN is input. The inductor L generates an electromotive force, based on an increase/decrease in input current according to the input voltage VIN.

The first switch MN1 is coupled between the first node ND1 and a ground, and forms or blocks a current path. The first switch MN1 allows the input current to be supplied to or blocked from the inductor L, so that the inductor L generates the electromotive force.

The second switch MP1 is coupled between the first node ND1 and a second node ND2, and forms or blocks a current path. The second switch MP1 supplies or blocks the input current provided through the inductor L.

The first and second switches MN1 and MP1 may generate and output the first voltage V1 while being alternately turned on/off.

A sensing unit 340 includes a third switch MP2 and a sensing voltage output unit 342.

The third switch MP2 is coupled between the second node ND2 and an output node ND_O, and forms or blocks a current path. The sensing voltage output unit 342 is coupled to both terminals of the third switch MP2 so as to output a sensing voltage according to the driving current. In a case where a separate resistor is added to sense the driving current, loss additionally occurs due to the separate resistor. Therefore, in order to minimize the loss, the driving current is preferably sensed using the turn-on resistance of the third switch MP2. When the DC-DC converter 300 is shut down, the third switch MP2 is in an off-state so as to block a leakage current path formed between the input node ND_I and the output node ND_O. The third switch MP2 is turned on/off in response to a control signal CON. The third switch MP2 is turned on in the normal operation of the DC-DC converter 300, and is turned off when the shut down of the DC-DC converter 300.

A control module 324 includes a PWM signal generating unit 324_4 and a switch driving unit 324_2.

The PWM signal generating unit 324_4 generates a PWM signal having a frequency determined according to the sensing voltage Vsense, and provides the PWM signal to the switch driving unit 324_2. If the sensing voltage Vsense increases, the PWM signal generating unit 324_4 increases the frequency of the PWM signal. If the sensing voltage Vsense decreases, the PWM signal generating unit 324_4 decreases the frequency of the PWM signal.

The switch driving unit 324_2 receives the PWM signal input from the PWM signal generating unit 324_4 so as to control the first and second switches MN1 and MP1. The switch driving unit 324_2 controls the first and second switches MN1 and MP1 so that the phases of PWM signals for controlling the respective first and second switches MN1 and MP1 are opposite to each other. In this case, the first and second switches MN1 and MP1 are alternately turned on/off. The switch driving unit 324_2 may generate a control signal CON for controlling the third switch MP2.

The DC-DC converter 300 may be a boost converter that generates the first voltage V1 by boosting the input voltage VIN. The first switch MN1 may be implement as an NMOS transistor, and the second switch MP1 may be implemented as a PMOS transistor.

The DC-DC converter 300 generates and outputs the first voltage V1 by boosting the input voltage VIN through the switching operation in which the first and second switches MN1 and MP1 are alternately turned on/off. Specifically, in a case where the first switch MN1 is turned on and the second switch MP1 is turned off, the first node ND1 is grounded. Accordingly, the current flowing in the inductor L is gradually increased, and a predetermined energy is charged in the inductor L. In a case where the first switch MN1 is turned off and the second switch MP1 is turned on, the input voltage VIN and the energy charged in the inductor L are provided to the output node ND_O. Therefore, the first voltage V1 higher than the input voltage VIN is output to the output node ND_O.

The DC-DC converter 300 may further include a first capacitor C1 coupled between the input node ND_I and the ground, and a second capacitor C2 coupled between the output node ND_O and the ground. In a case where the DC-DC converter 300 is implemented as a semiconductor chip, the inductor L of the switching module 322, the first capacitor C1 and the second capacitor C2 may be coupled to the semiconductor chip from the outside of the semiconductor chip.

Figure 4:
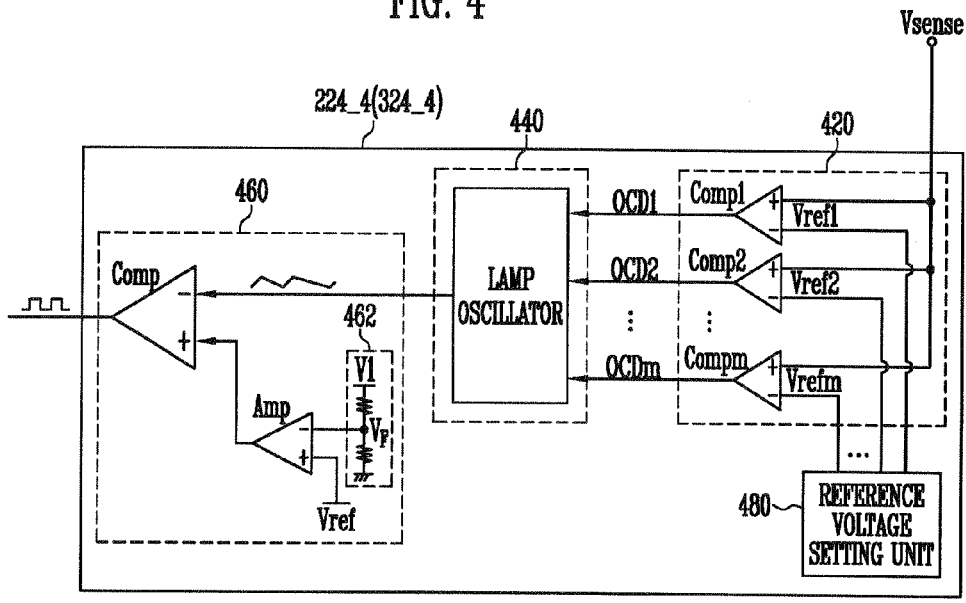
FIG. 4 is a diagram illustrating a pulse width modulation (PWM) signal generating unit shown in FIGS. 2 and 3.

FIG. 4 is a diagram illustrating a pulse width modulation (PWM) signal generating unit shown in FIGS. 2 and 3.

Referring to FIG. 4, the PWM signal generating unit 224_4 of FIG. 2 or the PWM signal generating unit 324_4 of FIG. 3 includes a frequency selection unit 420, a sawtooth wave generating unit 440 and a square wave generating unit 460.

The frequency selection unit 420 compares the sensing voltage Vsense with one or more reference voltages Vref1 to Vrefm, and generates frequency selection signals OCD1 to OCDm according to the compared result. To this end, the frequency selection unit 420 has m (m is a natural number) comparators Comp1 to Compm for comparing the sensing voltage Vsense with m reference voltages Vref1 to Vrefm. Each of the comparators Comp1 to Compm may output a high signal when the sensing voltage Vsense is greater than or identical to the reference voltage Vrefm, and may output a low signal when the sensing voltage Vsense is lower than the reference voltage Vrefm.

The sawtooth wave generating unit 440 generates a sawtooth wave having a corresponding frequency, in response to the frequency selection signal OCDm. To this end, the sawtooth wave generating unit 440 has a lamp oscillator.

Hereinafter, operations of the frequency selection unit 420 and the sawtooth wave generating unit 440 when the switching frequency may be set to one of four frequencies will be described in detail. To this end, the frequency selection unit 420 has three comparators Comp1, Comp2 and Comp3, and compares the sensing voltage Vsense with three reference voltages Vref1, Vref2 and Vref3. First, in a case where the sensing voltage Vsense is smaller than the first reference voltage Vref1 that is smaller than the second reference voltage Vref2 that is smaller than the third reference voltage Vref3 (Vsense<Vref1<Vref2<Vref3), the frequency selection unit 420 outputs all the frequency selection signals OCD1, OCD2 and OCD3 as a low signal. The sawtooth wave generating unit 440 generates a sawtooth wave having a first frequency (e.g., 80 KHz), in response to the first to third frequency selection signals OCD1, OCD2 and OCD3. Next, in a case where the first reference voltage Vref1 is smaller than or equal to the sensing voltage Vsense that is smaller than the second reference voltage Vref2 that is smaller than the third reference voltage Vref3 (Vref1≤Vsense<Vref2<Vref3), the frequency selection unit 420 outputs the first frequency selection signal OCD1 as a high signal, and outputs both the second and third frequency selection signals OCD2 and OCD3 as a low signal. The sawtooth wave generating unit 440 generates a sawtooth wave having a second frequency (e.g., 300 KHz), in response to the first to third frequency selection signals OCD1, OCD2 and OCD3. Next, in a case where the first reference voltage Vref1 is smaller than the second reference voltage Vref2 that is smaller than or equal to the sensing voltage Vsense that is smaller than the third reference voltage Vref3 (Vref1<Vref2≤Vsense<Vref3), the frequency selection unit 420 outputs the first and second frequency selection signals OCD1 and OCD2 as a high signal, and outputs the third frequency selection signal OCD3 as a low signal. The sawtooth wave generating unit 440 generates a sawtooth wave having a third frequency (e.g., 900 KHz), in response to the first to third frequency selection signals OCD1, OCD2 and OCD3. Finally, in a case where the first reference voltage Vref1 is smaller than the second reference voltage Vref2 that is smaller than the third reference voltage Vref3 that is smaller than or equal to the sensing voltage Vsense (Vref1<Vref2<Vref3≤Vsense), the frequency selection unit 420 outputs all the first to third frequency selection signals OCD1, OCD2 and OCD3 as a high signal. The sawtooth wave generating unit 440 generates a sawtooth wave having a fourth frequency (e.g., 1.5 MHz), in response to the first to third frequency selection signals OCD1, OCD2 and OCD3.

The square wave generating unit 460 converts the sawtooth wave into a PWM signal, using offset information on a feedback voltage $V_F$ and a setting voltage Vref, obtained by dividing the first voltage V1. To this end, the square wave generating unit 460 includes a voltage divider 462 that generates the feedback voltage $V_F$ by dividing the first voltage V1, an amplifier Amp that amplifies and outputs the difference between the feedback voltage $V_F$ and the setting voltage Vref, and a comparator Comp that compares the sawtooth wave and the output of the amplifier Amp, and outputs the PWM signal. The pulse width of the PWM signal is determined according to the output of the amplifier Amp. The amplifier Amp monitors the level of the feedback voltage $V_F$, and allows the first voltage V1 to be constantly maintained, regardless of the fluctuation of the driving current $I_D$. In a case where the level of the first voltage V1 is decreased due to a sudden increase in the driving current $I_D$, the pulse width of the PWM signal increases.

The PWM signal generating unit 224_4 of FIG. 2 or the PWM signal generating unit 324_4 of FIG. 3 may further include a reference voltage setting unit 480 that sets the plurality of reference voltages Vrefm.

The reference voltage setting unit 480 provides reference voltages Vref1 to Vrefm with which the sensing voltage Vsense is compared. The reference voltages Vref1 to Vrefm are controls, so that it is possible to change the switching frequency set according to a load condition.

Figure 5:
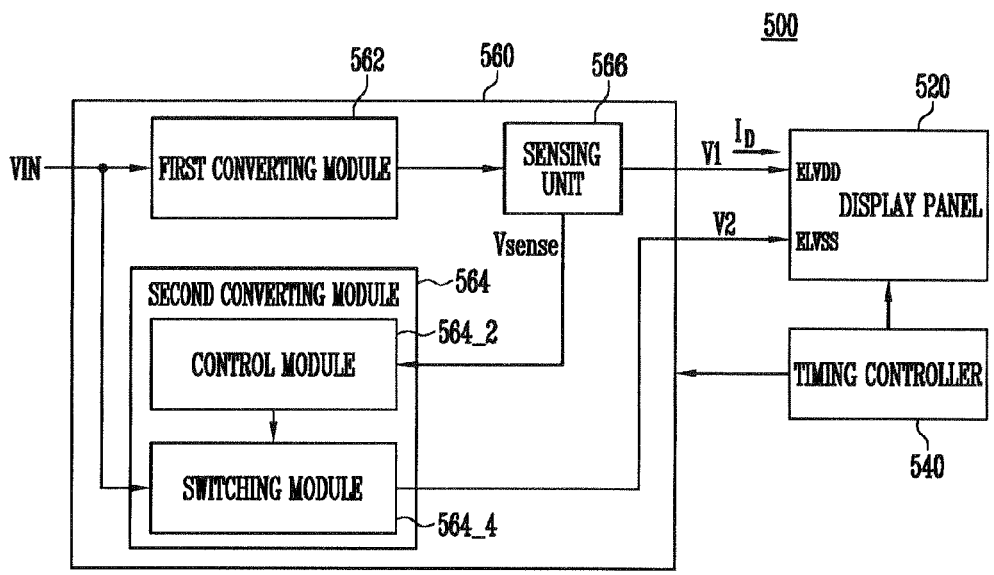
FIG. 5 is a diagram illustrating an organic light emitting display device according to an embodiment of the present invention.

FIG. 5 is a diagram illustrating an organic light emitting display device 500 according to an embodiment of the present invention.

Referring to FIG. 5, the organic light emitting display device 500 according to this embodiment includes a display panel 520, a timing controller 540 and a DC-DC converter 560.

The display panel 520 has a plurality of pixels (not shown), and displays a gray scale according to a degree of emission of an organic light emitting diode in each pixel, i.e., luminance.

The timing controller 540 provides the display panel 520 with scan and data signals for allowing the organic light emitting diode in each pixel to emit light. The display panel 520 displays an image in response to the scan and data signals.

The DC-DC converter 560 generates first and second voltages V1 and V2 for supplying current to the organic light emitting diode by receiving an input voltage VIN, and provides the generated first and second voltages V1 and V2 to the display panel 520. The first voltage V1 is a voltage ELVDD applied to an anode of the organic light emitting diode in each pixel of the display panel 520, and the second voltage V2 is a voltage ELVSS applied to a cathode of the organic light emitting diode in each pixel of the display panel 520.

The DC-DC converter 560 includes a first converting module 562, a second converting module 564 and a sensing unit 566.

The first converting module 562 receives the input voltage VIN so as to generate the first voltage V1. The first converting module 562 may be a boost converter that generates the first voltage V1 by boosting the input voltage VIN. The first voltage V1 may be a positive voltage.

The second converting module 564 receives the input voltage VIN so as to generate the second voltage V2. The second converting module 564 may be an inverting buck-boost converter that generates the second voltage V2 having a polarity opposite to that of the input voltage VIN. The input voltage YIN may be a positive voltage, and the second voltage V2 may be a negative voltage.

The sensing unit 566 senses driving current $I_D$ supplied to the display panel 520. Specifically, the sensing unit 566 is coupled between an output node of the first converting module 562 and a first output node from which the first voltage V1 is provided to the display panel 520 so as to sense the driving current $I_D$ and to output a sensing voltage Vsense.

The second converting module 564 includes a switching module 564_4 and a control module 564_2.

The switching module 564_4 has a plurality of switches. Each of the switches converts an input voltage VIN applied from the outside of the switching module 564_4 into a second voltage V2 and outputs the second voltage V2 while being switched in response to a corresponding PWM signal.

The control module 564_2 controls a switching operation of the switching module 564_4 by generating the PWM signal. The control module 564_2 is configured to adaptively control the frequency of the PWM signal according to the sensed result of the sensing unit 566. The frequency of the PWM signal is controlled so that voltage conversion can be normally performed while minimizing switching loss under the sensed load condition.

The frequency of the PWM signal may be set differently from that of the scan signal applied to the display panel 520 and the frequency of a harmonic wave of the scan frequency. In a case where coupling between the switching frequency for generating the second voltage V2 and the scan frequency of the display panel 520 occurs, a flicker may occur. Therefore, the control module 564_2 varies the frequency of the PWM signal according to a load condition while avoiding the frequency of the scan signal and the harmonic wave of the scan frequency. For example, the scan frequency of an organic light emitting display device, having a WXGA or HD screen resolution, is 78 KHz, and therefore, the lowest switching frequency in no load is set to 80 KHz. As the capacity of the load increases, the switching frequency increases. In this case, the switching frequency may increase while avoiding the harmonic wave of the scan frequency.

The second converting module 564 may have the configuration of the converting module 220 shown in FIG. 2. The sensing unit 566 may have the configuration of the sensing unit 340 shown in FIG. 3

The first converting module 562 may have the configuration of the converting module 320 shown in FIG. 3. Unlike the second converting module 564, the first converting module 562 does not operate by adaptively changing the frequency of the PWM signal according to the sensed result of the sensing unit 566.

Figure 6:
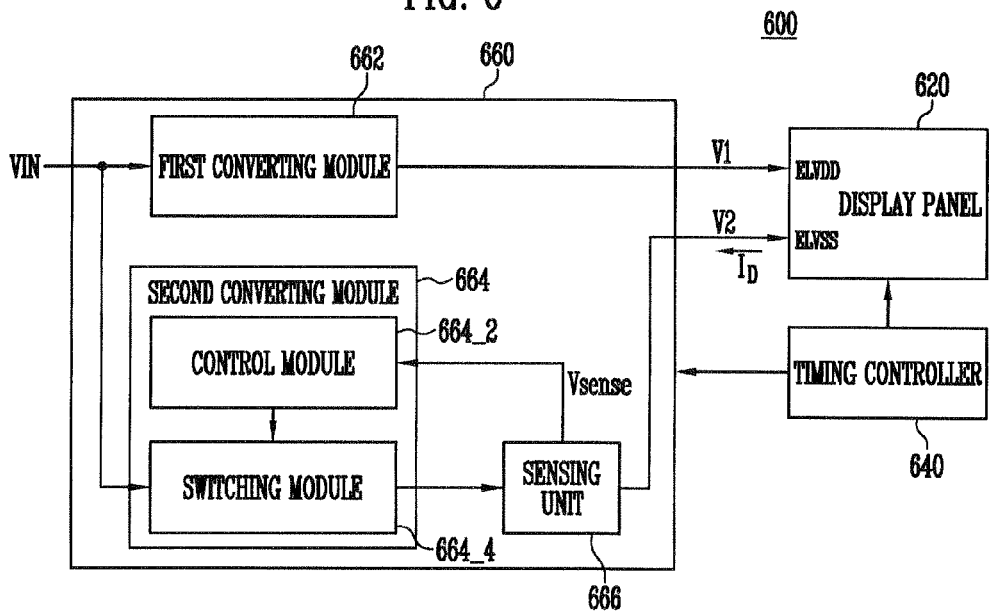
FIG. 6 is a diagram illustrating an organic light emitting display device according to another embodiment of the present invention.

FIG. 6 is a diagram illustrating an organic light emitting display device according to another embodiment of the present invention.

Referring to FIG. 6, the organic light emitting display device 600 according to this embodiment includes a display panel 620, a timing controller 640 and a DC-DC converter 660.

This embodiment is different from the embodiment of FIG. 5 in that a sensing unit 666 of the DC-DC converter 660 is coupled to an output terminal of a second converting module 664 and senses driving current $I_D$. A first converting module 662 may have the configuration of the converting module 320 shown in FIG. 3, and the second converting module 664 may have the configuration of the converting module 220 shown in FIG. 2. The sensing unit 666 may have the configuration of the sensing unit 240 shown in FIG. 2.

Meanwhile, the organic light emitting display device according to this embodiment may be implemented so that in the embodiments of FIGS. 5 and 6, the first converting module 562 or 662 operates by adaptively changing the frequency of the PWM signal according to the sensed result (Vsense) of the sensing unit 566 or 666, and the second converting module 564 or 664 operates by changing the frequency of the PWM signal, regardless of the sensed result (Vsense) of the sensing unit 566 or 666. In this case, the first converting module 562 or 662 may have the configuration of the converting module 320 shown in FIG. 3, and the second converting module 564 or 664 may have the configuration of the converting module 220 shown in FIG. 2.

Figure 7:
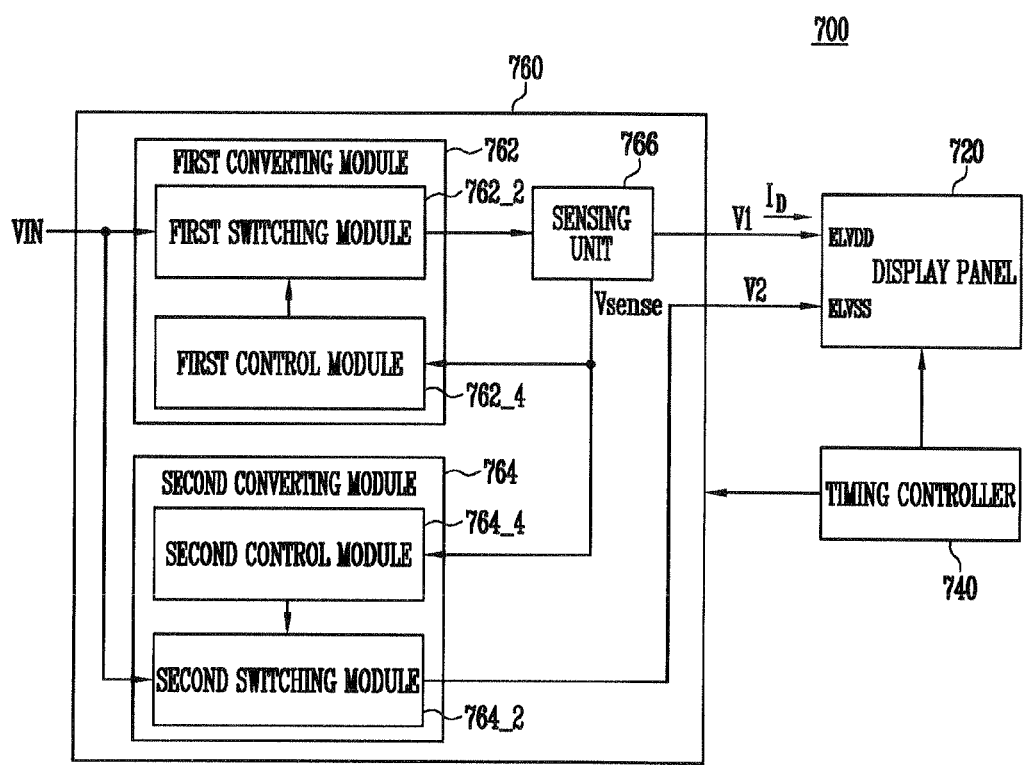
FIG. 7 is a diagram illustrating an organic light emitting display device according to still another embodiment of the present invention.

FIG. 7 is a diagram illustrating an organic light emitting display device according to still another embodiment of the present invention.

Referring to FIG. 7, the organic light emitting display device 700 according to this embodiment includes a display panel 720, a timing controller 740 and a DC-DC converter 760.

This embodiment is different from the embodiment of FIG. 5 in that first and second converting modules 762 and 764 of the DC-DC converter 700 are configured to adaptively control the frequency of the PWM signal, based on the sensed result of a sensing unit 766. The first converting module 762 may have the configuration of the converting module 320 shown in FIG. 3. The second converting module 764 may have the configuration of the converting module 220 shown in FIG. 2. The sensing unit 766 may have the configuration of the sensing unit 340 shown in FIG. 3.

Meanwhile, the organic light emitting display unit according to this embodiment may be implemented so that in the embodiment of FIG. 7, the sensing unit 766 of the DC-DC converter 760 is coupled to an output terminal of the second converting module 764 and senses driving current $I_D$. In this case, the sensing unit 766 may have the configuration of the sensing unit 240 shown in FIG. 2.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting display device, comprising:
   a display panel that has a plurality of pixels, and displays a gray scale according to the luminance of an organic light emitting diode in each pixel;
   a timing controller that provides the display panel with scan and data signals for allowing the organic light emitting diode in each pixel to emit light; and
   a DC-DC converter that receives an input voltage, which is supplied at an input node, so as to generate first and second voltages for supplying current to the organic light emitting diode and to provide the first and second voltages to the display panel, wherein the DC-DC converter comprises:
   a first converting module that receives the input voltage to generate the first voltage and to output the first voltage at a first output node;
   a second converting module that receives the input voltage to generate the second voltage and to output the second voltage at a second output node; and
   a sensing unit that senses driving current supplied to the display panel, the sensing unit including a third switch, wherein the first converting module comprises:
   a switching module that has a plurality of switches, the switching module converting the input voltage into the first voltage and outputting the first voltage at the first output node, each of the plurality of switches being turned on or off in response to a corresponding PWM signal; and
   a control module that controls a switching operation of the switching module by generating the PWM signal, wherein the control module is configured to adaptively control the frequency of the PWM signal according to the sensed result of the sensing unit, wherein the switching module includes a second switch connected between the input node and the first output node to form or block a current path, the third switch of the sensing unit connected between the second switch and the first output node, the second switch and third switch of the sensing unit being connected in series, wherein the control module increases the frequency of the PWM signal when the driving current increases, and decreases the frequency of the PWM signal when the driving current decreases.

2. The organic light emitting display device according to claim 1, wherein the switching module of the first converting module comprises:
 a first switch coupled between the input node and a first node so as to form or block a current path, the second switch connected between the first node and a second node; and
 an inductor coupled between the first node and a ground; wherein the control module of the second converting module comprises:
 a PWM signal generating unit that generates the PWM signal having a frequency determined according to the sensed result of the sensing unit; and
 a switch driving unit that controls the first and second switches.

3. The organic light emitting display device according to claim 2, wherein the sensing unit is coupled between an output node of the first converting module and the first output node to sense the driving current.

4. The organic light emitting display device according to claim 3, wherein the sensing unit comprises:
 a sensing voltage generating unit coupled to both terminals of the third switch so as to output a sensing voltage according to the driving current, the third switch coupled between the output node of the first converting module and the first output node.

5. The organic light emitting display device according to claim 4, wherein the PWM signal generating unit comprises:
 a frequency selection unit that compares the sensing voltage with a plurality of reference voltages, and generates a plurality of frequency selection signals according to the compared result;
 a sawtooth wave generating unit that generates a sawtooth wave having a corresponding frequency in response to the frequency selection signal; and
 a square wave generating unit that converts the sawtooth wave into the PWM signal, using offset information on a feedback voltage generated by dividing the output voltage and a setting voltage.

6. The organic light emitting display device according to claim 2, wherein the sensing unit is coupled between the second node and a second output node from which the second voltage is provided to the display panel so as to sense the driving current.

7. An organic light emitting display device, comprising:
 a display panel that has a plurality of pixels, and displays a gray scale according to the luminance of an organic light emitting diode in each pixel;
 a timing controller that provides the display panel with scan and data signals for allowing the organic light emitting diode in each pixel to emit light; and
 a DC-DC converter that receives an input voltage so as to generate first and second voltages for supplying current to the organic light emitting diode and to provide the first and second voltages to the display panel, wherein the DC-DC converter comprises:
 a first converting module that receives the input voltage so as to generate the first voltage;
 a second converting module that receives the input voltage so as to generate the second voltage; and
 a sensing unit that senses driving current supplied to the display panel, wherein each of the first and second converting modules comprises:
 a switching module that has a plurality of switches, each of the plurality of switches converting an input voltage into a first voltage and outputting the first voltage while being turned on or off in response to a corresponding PWM signal; and
 a control module that controls a switching operation of the switching module by generating the PWM signal, wherein at least one of the control modules of the first and second converting modules is configured to adaptively control the frequency of the PWM signal according to the sensed result of the sensing unit, wherein said at least one of the control modules of the first and second converting modules increases the frequency of the PWM signal when the driving current increases, and decreases the frequency of the PWM signal when the driving current decreases, wherein the switching module of the first converting module comprises:
 a first inductor coupled between the input node and a first node;
 a first switch coupled between the first node and a ground so as to form or block a current path; and
 a second switch coupled between the first node and a second node so as to form or block a current path, wherein the control module of the first converting module comprises:
 a first PWM signal generating unit that generates a first PWM signal having a frequency determined according to the sensed result of the sensing unit; and
 a first switch driving unit that controls the first and second switches, wherein the switching module of the second converting module comprises:
 a third switch coupled between the input node and a third node so as to form or block a current path;
 a second inductor coupled between the third node and a ground; and
 a fourth switch coupled between the third node and a fourth node so as to form or block a current path, wherein the control module of the second converting module comprises:
 a second PWM signal generating unit that generates a second PWM signal having a frequency determined according to the sensed result of the sensing unit; and
 a second switch driving unit that controls the third and fourth switches.

8. The organic light emitting display device according to claim 7, wherein the sensing unit is coupled between the second node and a first output node from which the first voltage is provided to the display panel so as to sense the driving current.

9. The organic light emitting display device according to claim 8, wherein the sensing unit comprises:
 a third switch coupled between the second node and the first output node; and
 a sensing voltage generating unit coupled to both terminals of the third switch so as to sense a sensing voltage according to the driving current.

10. The organic light emitting display device according to claim 9, wherein each of the first and second PWM signal generating units comprises:

a frequency selection unit that compares the sensing voltage with a plurality of reference voltages, and generates frequency selection signals according to the compared result;
a sawtooth wave generating unit that generates a sawtooth wave having a corresponding frequency in response to the frequency selection signal; and
a square wave generating unit that converts the sawtooth wave into the first or second PWM signal, using offset information on a feedback voltage generated by dividing the output voltage and a setting voltage.

* * * * *